US 6,593,815 B2

(12) United States Patent
Takahashi

(10) Patent No.: US 6,593,815 B2
(45) Date of Patent: Jul. 15, 2003

(54) FULL DIGITAL PHASE LOCKED LOOP AND CIRCUITRY FOR UTILIZING THE SAME

(75) Inventor: Hideaki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/092,884

(22) Filed: Mar. 8, 2002

(65) Prior Publication Data

US 2002/0130724 A1 Sep. 19, 2002

(30) Foreign Application Priority Data

Mar. 15, 2001 (JP) ........................................ 2001-074137

(51) Int. Cl.$^7$ .................................................. H03L 7/00
(52) U.S. Cl. ....................... 331/1 A; 327/156; 327/159; 327/160
(58) Field of Search ................................. 327/156–159; 331/1 A, 17, 25, 57; 375/376

(56) References Cited

U.S. PATENT DOCUMENTS 6,392,496 B1 * 5/2002 Lee et al. ..................... 331/17

* cited by examiner

Primary Examiner—Kenneth B. Wells
(74) Attorney, Agent, or Firm—Sughrue Mion, PLLC

(57) ABSTRACT

A full digital phase locked loop includes a first counter for continuously counting pulses of a first clock pulse stream to produce a varying count number. A second counter counts pulses of a second clock pulse stream to produce a reference signal when a predetermined number of the pulses is counted. The augend input terminals of an adder receive the varying count number of the first. A comparison signal which appears at one of the adder's output terminals is applied to an exclusive-OR gate for detecting an interval between it and the reference signal. A resettable counter counts pulses of the second pulse stream during the detected interval and produces a count number at periodic intervals. Successively produced count numbers are differentiated and the differentiated count number is supplied to the addend input terminals of the adder as a frequency difference feedback signal.

13 Claims, 3 Drawing Sheets

FULL DIGITAL PHASE LOCKED LOOP AND CIRCUITRY FOR UTILIZING THE SAME

BACKGROUND OF THE INVENTION

1. Field of the Invention

The present invention relates generally to frequency synthesizers and more specifically to circuitry for producing a phase-locked clock pulse stream of desired frequency using all digital circuit components and circuitry for utilizing the phase-locked pulse stream for producing a frequency modulated signal.

2. Description of the Related Art

FIGS. 3, 4 and 5 are illustrations of typical examples of phase locked loops generally used in prior art frequency synthesizers. In FIG. 3 the phase locked loop is comprised by a voltage controlled oscillator 1 (or voltage controlled crystal oscillator), a phase detector 2 for making a phase comparison between a reference frequency (Fref) and the output of the voltage controlled oscillator and a low-pass filter 3 for smoothing the output of the phase detector 2 to produce a d.c. frequency control signal which drives the voltage controlled oscillator 1 to produce an output signal of desired frequency (Fout). In FIG. 4, a given frequency is synchronized to a reference frequency by coupling the output of the voltage controlled oscillator 1 to a divide-by-N counter 4. Using a second divide-by-M counter 5 the reference frequency is divided by M so that the reference frequency is reduced to a level comparable at the inputs of the phase detector 2 to the output of the divide-by-N counter 4.

If the output of the voltage controlled oscillator 1 is equal to (N/M)×Fref (reference frequency), the frequency synthesizer can produce an output frequency with the same level of stability as the reference frequency. In addition, the phase locked loop of this type is used in most cases to produce a signal which serves to determine the transmit frequency of a wireless system at a desired frequency on an as-needed basis. When a need exists for changing the output frequency, the integer N is controlled according to the desired frequency. However, in terms of the loop stability and the time taken to change frequencies, the phase locked loop of FIG. 4 is not satisfactory. In order to solve this problem, a direct digital synthesizer has been developed as shown in FIG. 5. In the DDS phase locked loop, the reference frequency is controlled to produce a desired output frequency. A high stability oscillator is connected to a read only memory 6 in which various waveforms are stored in different address locations. By switching between different address locations, reference frequencies are altered. Since the speed at which the reference frequency is changed depends on the speed at which the address locations are switched, it is possible to perform high speed switching of reference frequency. By using the generated signal as a reference frequency of a phase locked loop, the output signal of the voltage controlled oscillator 1 is switched at a high speed. Since the operation of the phase locked loop of this type is irrelevant to the basic parameters of the phase locked loop, i.e., the sensitivity of the voltage controlled oscillator, the sensitivity of the phase detector and the filter coefficient, very high loop stability can be obtained.

However, the prior art phase locked loops require the use of analog circuit components such as voltage controlled oscillator and lowpass filter. In addition, while satisfactory for operation at relatively high frequencies, the prior art suffers poor stability for operation at relatively low frequencies. The poor stability can only be solved by the use of a large capacitor and a large resistor for the lowpass filter.

SUMMARY OF THE INVENTION

It is therefore an object of the present invention to provide a full digital phase locked loop that produce a stabilized output frequency without using analog circuit components.

According to a first aspect of the present invention, there is provided a full digital phase locked loop comprising a first counter for continuously counting pulses of a first clock pulse stream and producing a varying count number of the counted pulses, a second counter for counting pulses of a second clock pulse stream and producing a reference signal when a predetermined number of the pulses is counted, summation circuitry having a plurality of augend input terminals for receiving the varying count number from the first counter, a plurality of addend input terminals and a plurality of output terminals, one of the output terminals producing a comparison signal, an exclusive-OR gate for detecting an interval between the comparison signal and the reference signal, resettable counter circuitry for counting pulses of the second pulse stream during the detected interval and producing a count number of the counted pulses and resetting the count number at periodic intervals, and differentiation circuitry for differentiating count numbers from the resettable counter circuitry and producing a differentiated count number and supplying the differentiated count number to the plurality of addend input terminals of the summation circuitry.

According to a second aspect, the present invention provides a method of producing a desired frequency comprising the steps of (a) continuously counting pulses of a first clock pulse stream and producing a varying digital count number of the counted pulses, (b) counting pulses of a second clock pulse stream and producing a reference signal when a predetermined number of the pulses is counted, (c) summing the varying digital count number of step (a) with a digital difference signal to produce a comparison signal, (d) detecting an interval between the reference signal and the comparison signal, (e) counting pulses of the second pulse stream of step (b) during the detected interval and producing a digital count number of the counted pulses, (f) differentiating digital count numbers successively generated by step (e) to produce a differentiated digital count number, and (g) repeating steps (c) to (f) by using the differentiated digital count number of step (f) as the digital difference signal of step (c).

According to a third aspect, the present invention provides a frequency synthesizer comprising a first pulse generator for producing a first clock pulse stream, a first counter for continuously counting pulses of the first clock pulse stream and producing a varying count number of the counted pulses, a second pulse generator for producing a second clock pulse stream, a second counter for counting pulses of the second clock pulse stream and producing a reference signal when a predetermined number of the pulses is counted, summation circuitry having a plurality of augend input terminals for receiving the varying count number from the first counter, a plurality of addend input terminals and a plurality of output terminals, one of the output terminals producing a comparison signal, an exclusive-OR gate for detecting an interval between the comparison signal and the reference signal, resettable counter circuitry for counting pulses of the second pulse stream during the detected interval and producing a count number of the counted pulses and resetting the count number at periodic intervals, and differentiation circuitry for differentiating count numbers from the resettable counter circuitry and producing a differentiated count number and supplying the differentiated count number to the plurality of addend input terminals of the summation circuitry. With this arrangement, an output clock pulse stream of desired frequency can be obtained at one of the output terminals of the summation circuitry.

According to a fourth aspect, the present invention provides a frequency modulator comprising a first pulse generator for producing a first pulse stream, a first counter for continuously counting pulses of the first pulse stream and producing a varying count number of the counted pulses, a second pulse generator for producing a second pulse stream, a second counter for counting pulses of the second pulse stream and producing a reference signal when a predetermined number of the pulses is counted, first summation circuitry having a plurality of augend input terminals for receiving the varying count number from the first counter, a plurality of addend input terminals and a plurality of output terminals, one of the output terminals producing a comparison signal, an exclusive-OR gate for detecting an interval between the comparison signal and the reference signal, resettable counter circuitry for counting pulses of the second pulse stream during the detected interval and producing a count number of the counted pulses and resetting the count number at periodic intervals, differentiation circuitry for differentiating count numbers from the resettable counter circuitry and producing a differentiated count number and supplying the differentiated count number to the plurality of addend input terminals of the summation circuitry, and second summation circuitry for summing a digital modulating signal with the differentiated count number to produce a set of output signals indicating the summed differentiated count number and supplying the set of output signals to the addend terminals of the first summation circuitry. With this arrangement, a frequency modulated signal can be obtained at one of the summation output terminals of the first summation circuitry.

BRIEF DESCRIPTION OF THE DRAWINGS

The present invention will be described in detail further with reference to the following drawings, in which.

DETAILED DESCRIPTION

Figure 1:
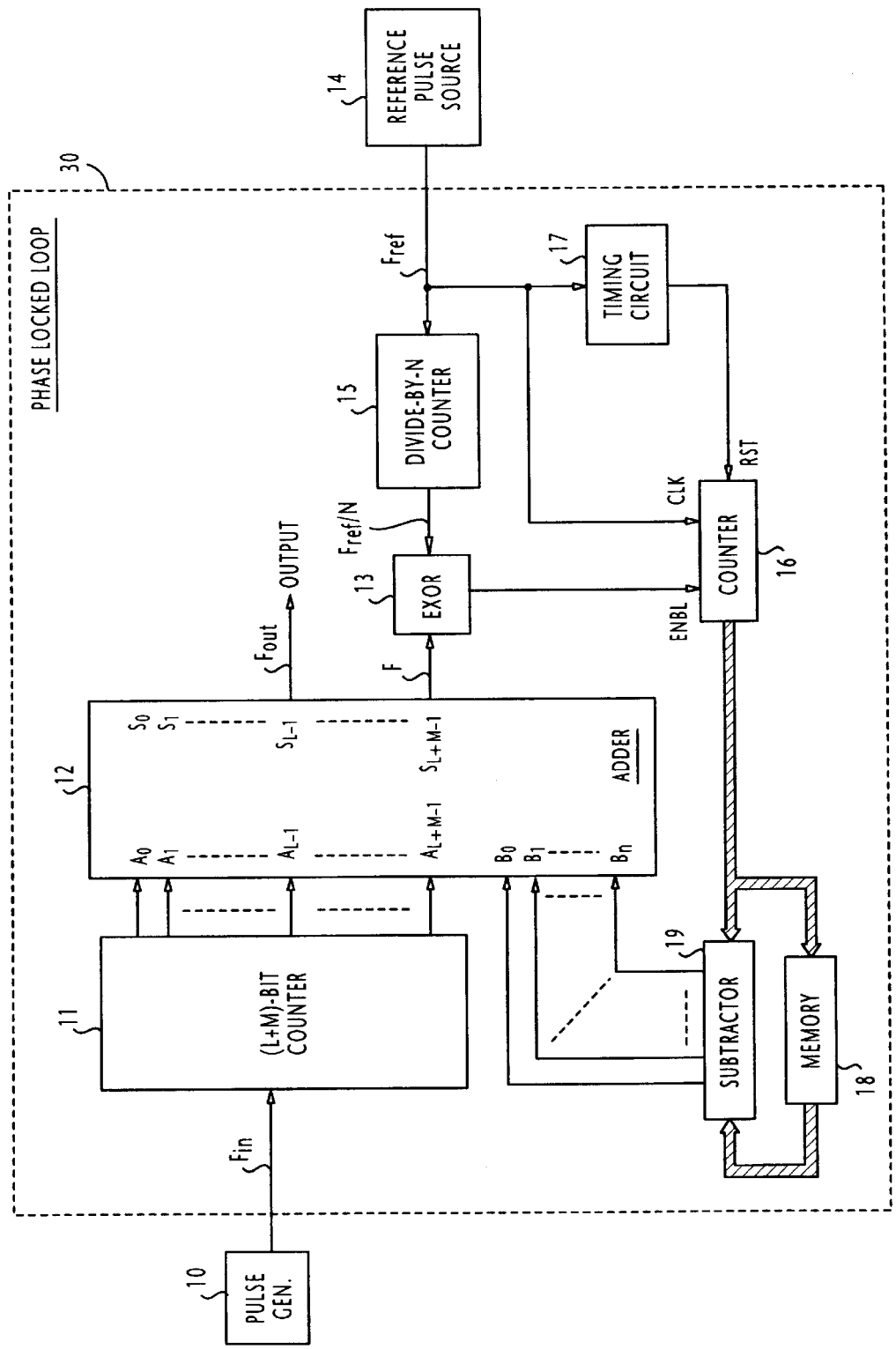
FIG. 1 is a block diagram of a full digital phase locked loop according to the present invention.

In FIG. 1, there is shown a frequency synthesizer which is implemented by a full digital phase locked loop of the present invention.

The full digital phase locked loop, shown within a broken-line rectangle 30, includes an (L+M)-bit binary counter 11 for continuously counting a clock pulse stream at frequency $F_{in}$ from a pulse generator 10 of the type designed for modest precision and stability requirements drives with a clock pulse stream (where L equals an integral multiple of decimal 4 and M equals an integral multiple of decimal 2). Counter 11 produces (L+M) binary outputs representing the instantaneous value of a modulo-(L+M) binary count number of the clock pulse stream.

Phase locked loop 1 includes an adder 12 having a set of augend terminals $A_0 \sim A_{L+M-1}$, a set of addend terminals $B_0 \sim B_n$, and a set of output terminals $S_0 \sim S_{L+M-1}$ where binary outputs of a modulo-(L+M) summed augend and addend inputs are produced. The binary outputs of the counter 11 are connected to the augend terminals $A_0 \sim A_{L+M-1}$.

When the addend terminals $B_0 \sim B_n$ of the adder 12 are all zero's, the binary inputs of the augend terminals $A_0 \sim A_{L+M-1}$ appear respectively at the summation output terminals $S_0 \sim S_{L+M-1}$. Under this circumstance, a pulse train of frequency $F=F_{in}/(L \times M)$ appears at the summation output terminal $S_{L+M-1}$. This pulse train is supplied to a first input of an exclusive-OR gate 13 as a phase comparison signal.

A desired output frequency $F_{out}$ can be obtained at one of the summation output terminals $S_0 \sim S_{+M-1}$. In the illustrated embodiment, the desired output frequency $F_{out}$ is obtained from the output terminal $S_{L-1}$, for example.

Phase locked loop 1 receives a reference pulse stream at frequency $F_{ref}$ from a reference pulse source 14. A divide-by-N counter 15 divides this reference frequency by an integer N and supplies an output signal at frequency $F_{ref}/N$ to the second input of exclusive-OR gate 13 as a phase reference signal for comparison with the phase comparison signal from the adder 12.

As a result, the exclusive-OR gate 13 produces an output pulse of duration corresponding to the instantaneous phase difference between the phase comparison signal and the phase reference signal.

The output of exclusive-OR gate 13 is connected to an enable input of a counter 16. As long as the counter 16 is enabled, the latter increments its count value in response to reference pulses from the reference pulse source 14 and produces a binary count number of the reference pulses that corresponds to the instantaneous phase difference.

In order to perform the phase comparison at periodic intervals, the counter 16 is reset by a timing circuit 17 which is connected to the reference pulse source 14.

The count numbers successively generated by the counter 16 are converted to a binary frequency difference count number by differentiation circuitry implemented with a memory 18 and a subtractor 19.

Phase difference count numbers are produced successively by the counter 16 and stored in the memory 18. A difference between successive phase difference count numbers is detected by the subtractor 19 to produce a frequency difference count number. The frequency difference count number is supplied to the addend terminals $B_0 \sim B_n$ of the adder 12 as an addend value, where it is summed with the augend value supplied from the (L+M)-bit counter 11. Adder 12 modulo-sums the frequency difference binary outputs with the binary outputs of counter 11. Therefore, the frequency of the signal at the summation output terminal $S_{L+M-1}$ is caused to vary in a direction corresponding to the polarity of the frequency difference signal and in an amount corresponding to the magnitude of the frequency difference.

As the feedback operation continues, the frequency difference substantially reduces to zero. When this occurs, the output signal of summation output terminal $S_{L+M-1}$ is locked in phase with the phase reference signal, and hence the desired output frequency $F_{out}$ is also locked in phase with the reference signal. Since the bit position of summation output terminal $S_{L-1}$ is lower than the summation output terminal $S_{L+M-1}$, a desired frequency that is $2^M$ times higher than the frequency F is obtained.

It is seen that the full digital phase locked loop of the present invention can be implemented without using analog circuit components such as voltage controlled oscillator and loop filter.

Figure 2:
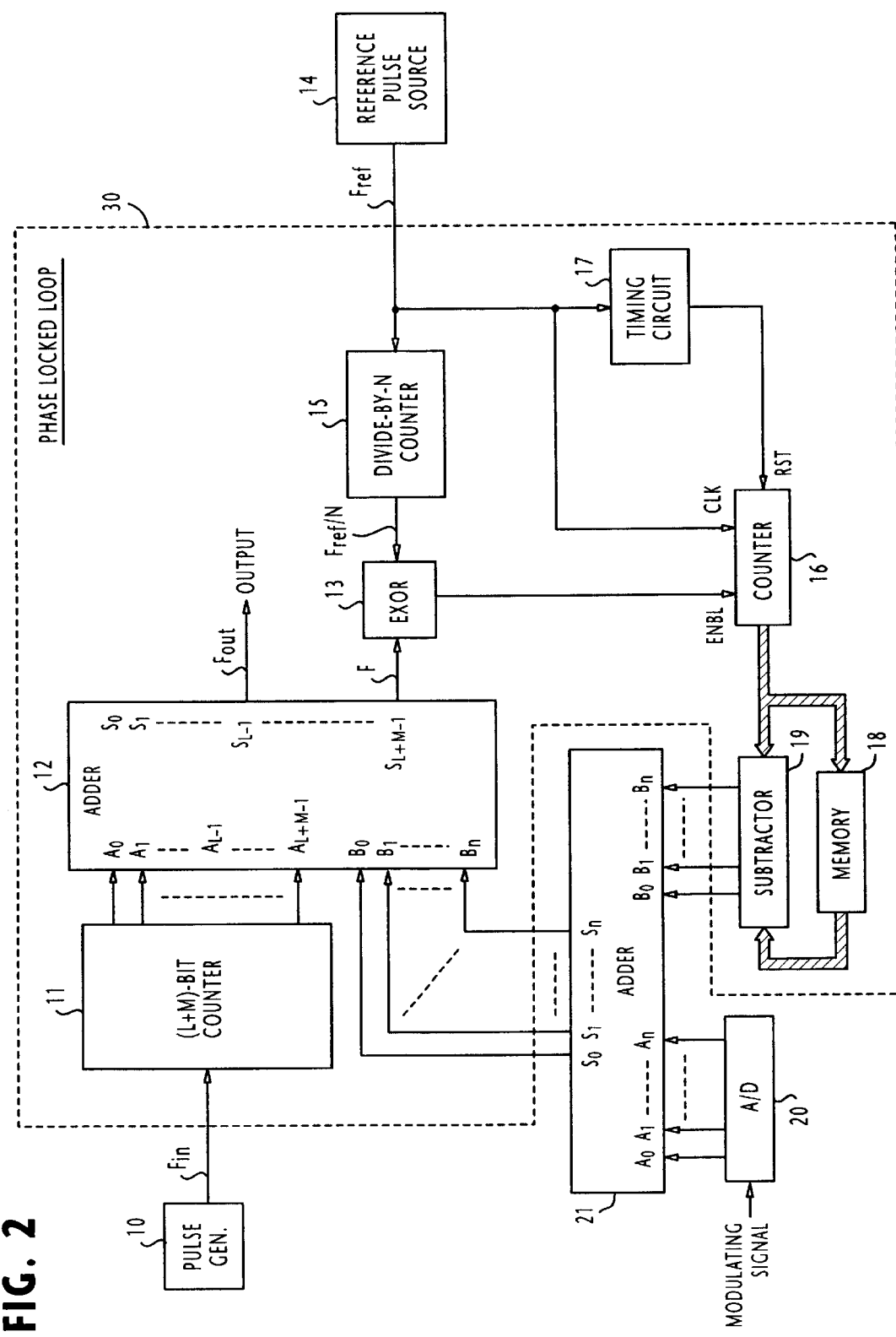
FIG. 2 is a block diagram of a modified embodiment of the present invention.
Figure 3:
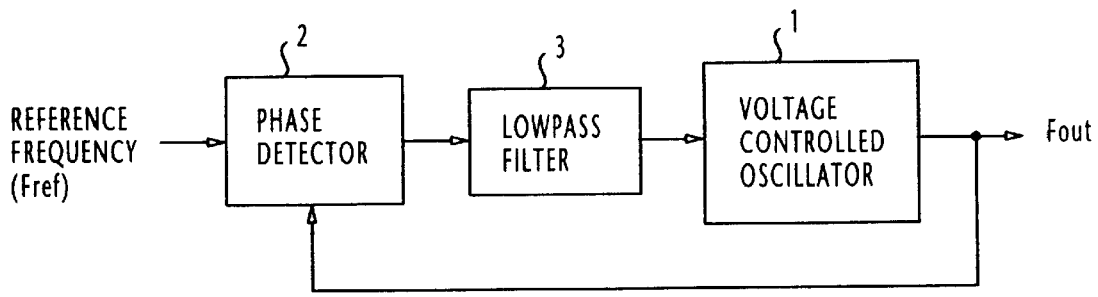
FIGS. 3, 4 and 5 are block diagrams of prior art phase locked loops.
Figure 4:
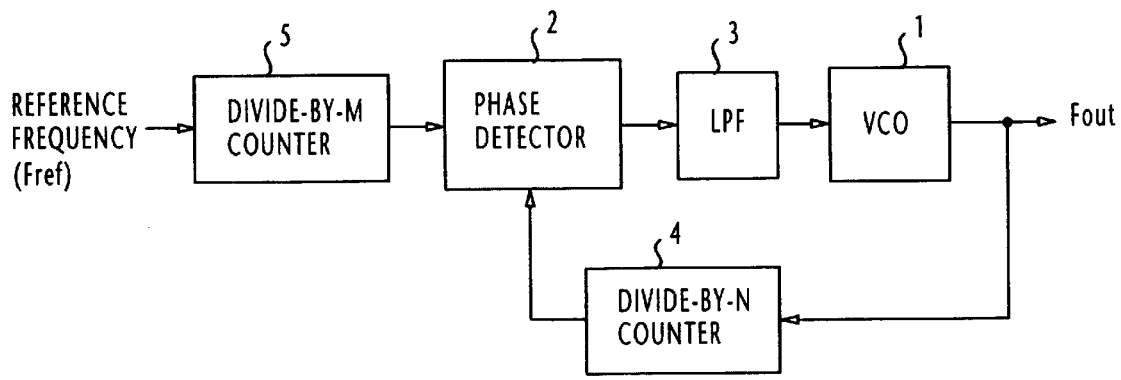
Figure 5:
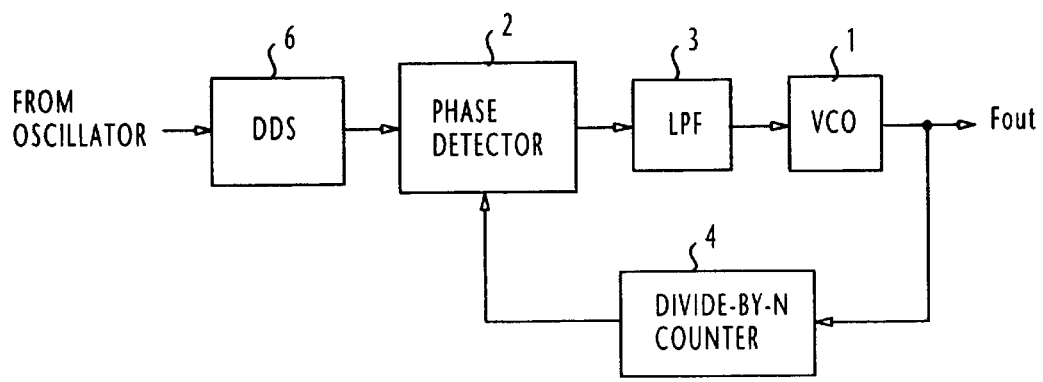

FIG. 2 is a block diagram of a modified embodiment of the present invention, in which parts corresponding in significance to those in FIG. 1 are marked with the same numerals.

In this modification, the frequency difference between the input frequency $F_{in}$ and the output frequency $F_{out}$ is not reduced to zero. Instead, the output frequency is caused to vary with a modulating signal to produce a frequency-modulated signal at the summation output terminal $S_{L-1}$ of adder 12. To this end, the frequency synthesizer of FIG. 2 further includes an analog-to-digital converter 20 and an adder 21. A frequency-modulating analog signal is applied to the A/D converter 20 where it is sampled and a set of binary outputs corresponding to the sample value are generated.

The binary outputs of A/D converter 20 are supplied to augend input terminals $A_0$ to $A_n$ of adder 21 and the outputs of the subtractor 19 are supplied to the addend input terminals $B_0$ to $B_n$ of the adder 21. A set of modulo-n summed binary outputs appear at the summation output terminals $S_0$ to $S_n$ of the adder 21. The summation output terminals $S_0$ to $S_n$ of the adder 21 are coupled to the addend input terminals $B_0$ to $B_n$ of the adder 12.

What is claimed is:

1. A full digital phase locked loop comprising:

a first counter for continuously counting pulses of a first clock pulse stream and producing a varying count number of the counted pulses;

a second counter for counting pulses of a second clock pulse stream and producing a reference signal when a predetermined number of the pulses is counted;

summation circuitry having a plurality of augend input terminals for receiving said varying count number from said first counter, a plurality of addend input terminals and a plurality of output terminals, one of the output terminals producing a comparison signal;

an exclusive-OR gate for detecting an interval between said comparison signal and said reference signal;

resettable counter circuitry for counting pulses of said second pulse stream during said detected interval and producing a count number of the counted pulses and resetting the count number at periodic intervals; and differentiation circuitry for differentiating count numbers from said resettable counter circuitry and producing a differentiated count number and supplying the differentiated count number to said plurality of addend input terminals of the summation circuitry, whereby an output clock pulse stream of desired frequency can be obtained at one of the output terminals of said summation circuitry.

2. The full digital phase locked loop of claim 1, wherein said output clock pulse stream is produced at one of said output terminals of the summation circuitry which is different from said one of the output terminals at which said comparison signal is produced.

3. The full digital phase locked loop of claim 1, wherein said differentiation circuit comprises a memory for storing said count numbers supplied from said resettable counter and a subtractor for detecting a difference between the stored count numbers to produce said differentiated count number.

4. The full digital phase locked loop of claim 1, further comprising an analog-to-digital converter for converting a modulating signal to a digital signal and second summation circuitry for summing the digital signal with said differentiated count number and supplying the outputs of the second summation circuitry to the addend terminals of the first-mentioned summation circuitry.

5. A frequency synthesizer comprising:

a first pulse generator for producing a first clock pulse stream;

a first counter for continuously counting pulses of the first clock pulse stream and producing a varying count number of the counted pulses;

a second pulse generator for producing a second clock pulse stream;

a second counter for counting pulses of the second clock pulse stream and producing a reference signal when a predetermined number of the pulses is counted;

summation circuitry having a plurality of augend input terminals for receiving said varying count number from said first counter, a plurality of addend input terminals and a plurality of output terminals, one of the output terminals producing a comparison signal;

an exclusive-OR gate for detecting an interval between said comparison signal and said reference signal;

resettable counter circuitry for counting pulses of said second pulse stream during said detected interval and producing a count number of the counted pulses and resetting the count number at periodic intervals; and differentiation circuitry for differentiating count numbers from said resettable counter circuitry and producing a differentiated count number and supplying the differentiated count number to said plurality of addend input terminals of the summation circuitry, whereby an output clock pulse stream of desired frequency can be obtained at one of the output terminals of said summation circuitry.

6. The frequency synthesizer of claim 5, wherein said output clock pulse stream is produced at one of said output terminals of the summation circuitry which is different from said one of the output terminals at which said comparison signal is produced.

7. The frequency synthesizer of claim 1, wherein said differentiation circuit comprises a memory for storing said count numbers supplied from said resettable counter and a subtractor for detecting a difference between the stored count numbers to produce said differentiated count number.

8. A frequency modulator comprising:

a first pulse generator for producing a first pulse stream;

a first counter for continuously counting pulses of the first pulse stream and producing a varying count number of the counted pulses;

a second pulse generator for producing a second pulse stream;

a second counter for counting pulses of the second pulse stream and producing a reference signal when a predetermined number of the pulses is counted;

first summation circuitry having a plurality of augend input terminals for receiving said varying count number from said first counter, a plurality of addend input terminals and a plurality of output terminals, one of the output terminals producing a comparison signal;

an exclusive-OR gate for detecting an interval between said comparison signal and said reference signal;

resettable counter circuitry for counting pulses of said second pulse stream during said detected interval and producing a count number of the counted pulses and resetting the count number at periodic intervals;

differentiation circuitry for differentiating count numbers from said resettable counter circuitry and producing a differentiated count number and supplying the differentiated count number to said plurality of addend input terminals of the summation circuitry; and second summation circuitry for summing a digital modulating signal with said differentiated count number to produce a set of output signals indicating the summed differentiated count number and supplying the set of output signals to the addend terminals of the first summation circuitry, whereby a frequency modulated signal can be obtained at one of the summation output terminals of the first summation circuitry.

9. The frequency modulator of claim 8, wherein said frequency modulated signal is produced at one of said output terminals of the summation circuitry which is different from said one of the output terminals at which said comparison signal is produced.

10. The frequency modulator of claim 8, wherein said differentiation circuit comprises a memory for storing said count numbers supplied from said resettable counter and a subtractor for detecting a difference between the stored count numbers to produce said differentiated count number.

11. A method of producing a desired frequency comprising the steps of:

a) continuously counting pulses of a first clock pulse stream and producing a varying digital count number of the counted pulses;

b) counting pulses of a second clock pulse stream and producing a reference signal when a predetermined number of the pulses is counted;

c) summing said varying digital count number of step (a) with a digital difference signal to produce a comparison signal;

d) detecting an interval between said reference signal and said comparison signal;

e) counting pulses of the second pulse stream of step (b) during said detected interval and producing a digital count number of the counted pulses;

f) differentiating digital count numbers successively generated by step (e) to produce a differentiated digital count number; and g) repeating steps (c) to (f) by using the differentiated digital count number of step (f) as said digital difference signal of step (c).

12. The method of claim 11, wherein the step (f) comprises the steps of storing said digital count numbers successively produced by step (e) and detecting a difference between the stored digital count numbers to produce said differentiated digital count number.

13. The method of claim 11, further comprising the steps of converting an analog modulating signal to a digital modulating signal and summing the digital modulating signal with said differentiated digital count number.

* * * * *